United States Patent
Matsuda et al.

(10) Patent No.: US 8,877,643 B2
(45) Date of Patent: Nov. 4, 2014

(54) METHOD OF POLISHING A SILICON WAFER

(75) Inventors: Shuhei Matsuda, Tokyo (JP); Tetsuro Iwashita, Tokyo (JP); Ryuichi Tanimoto, Tokyo (JP); Takeru Takushima, Tokyo (JP); Takeo Katoh, Tokyo (JP)

(73) Assignee: Sumco Corporation, Tokyo (JP)

(*) Notice: Subject to any disclaimer, the term of this patent is extended or adjusted under 35 U.S.C. 154(b) by 0 days.

(21) Appl. No.: 13/376,259

(22) PCT Filed: May 28, 2010

(86) PCT No.: PCT/JP2010/059487
§ 371 (c)(1),
(2), (4) Date: Dec. 5, 2011

(87) PCT Pub. No.: WO2010/140671
PCT Pub. Date: Dec. 9, 2010

(65) Prior Publication Data
US 2012/0080775 A1 Apr. 5, 2012

(30) Foreign Application Priority Data
Jun. 5, 2009 (JP) ................................. 2009-136020

(51) Int. Cl.
*H01L 21/461* (2006.01)
*H01L 21/02* (2006.01)
*B24B 37/04* (2012.01)
*C09G 1/02* (2006.01)

(52) U.S. Cl.
CPC ........ *H01L 21/02024* (2013.01); *B24B 37/044* (2013.01); *C09G 1/02* (2013.01); *Y10S 438/959* (2013.01)
USPC ............ 438/691; 438/692; 438/693; 438/959

(58) Field of Classification Search
USPC .................... 438/691, 692, 693, 959
See application file for complete search history.

(56) References Cited

U.S. PATENT DOCUMENTS

| | | | |
|---|---|---|---|
| 6,338,744 B1 | 1/2002 | Tateyama et al. | |
| 6,524,961 B1 * | 2/2003 | Katagiri et al. | ............... 438/691 |

(Continued)

FOREIGN PATENT DOCUMENTS

| | | | |
|---|---|---|---|
| DE | 10 2009 031 356 A1 | 1/2010 | |
| JP | 2000-208451 A | 7/2000 | |

(Continued)

OTHER PUBLICATIONS

International Search Report mailed Aug. 17, 2010 for Application No. PCT/JP2010/059487.

(Continued)

*Primary Examiner* — Ngan Ngo
(74) *Attorney, Agent, or Firm* — Thomas J. Engellenner; Reza Mollaaghababa; Pepper Hamilton LLP

(57) ABSTRACT

This invention is to provide a method of polishing a silicon wafer wherein a high flatness can be attained likewise the conventional polishing method and further the occurrence of defects due to the remaining of substances included in the polishing solution on the surface of the wafer can be suppressed as well as a polished silicon wafer. The method of polishing a silicon wafer by supplying a polishing solution containing abrasive grains onto a surface of a polishing pad and then relatively sliding the polishing pad to a silicon wafer to polish the surface of the silicon wafer, is characterized in that the number of abrasive grains included in the polishing solution is controlled to not more than $5 \times 10^{13}$ grains/cm$^3$.

7 Claims, 3 Drawing Sheets

(56) References Cited

U.S. PATENT DOCUMENTS

| | | | |
|---|---|---|---|
| 6,723,144 B2* | 4/2004 | Katagiri et al. | 51/308 |
| 6,846,600 B2* | 1/2005 | Ehara et al. | 430/66 |
| 8,323,368 B2* | 12/2012 | Takakuma et al. | 51/309 |
| 8,506,359 B2* | 8/2013 | Shida et al. | 451/36 |
| 2003/0051413 A1* | 3/2003 | Sakai et al. | 51/307 |
| 2003/0084998 A1* | 5/2003 | Katagiri et al. | 156/345.12 |
| 2003/0154659 A1 | 8/2003 | Xu et al. | |
| 2005/0178742 A1* | 8/2005 | Chelle et al. | 216/88 |
| 2007/0074457 A1* | 4/2007 | Ito et al. | 51/308 |
| 2007/0202703 A1* | 8/2007 | Shimizu et al. | 438/692 |
| 2007/0266640 A1 | 11/2007 | Ohta et al. | |
| 2008/0115423 A1* | 5/2008 | Kashima et al. | 51/308 |
| 2008/0120918 A1* | 5/2008 | Hattori et al. | 51/308 |
| 2008/0127573 A1 | 6/2008 | Roh et al. | |
| 2008/0173843 A1* | 7/2008 | Hotta et al. | 252/79.1 |
| 2008/0289261 A1* | 11/2008 | Hattori et al. | 51/308 |
| 2009/0127500 A1* | 5/2009 | Hirano et al. | 252/79.1 |
| 2011/0195888 A1* | 8/2011 | Kurashima et al. | 510/175 |
| 2012/0153218 A1* | 6/2012 | Hirano et al. | 252/79.1 |

FOREIGN PATENT DOCUMENTS

| | | |
|---|---|---|
| JP | 2000-288909 A | 10/2000 |
| JP | 2005-286047 A | 10/2005 |
| KR | 2004-0050721 A | 6/2004 |
| KR | 2004-0103946 A | 12/2004 |
| KR | 100679198 A | 2/2007 |
| KR | 20070029601 A | 3/2007 |
| KR | 2007-0067270 A | 6/2007 |
| KR | 20080018822 A | 2/2008 |
| KR | 20080018823 A | 2/2008 |
| KR | 2009125058 A | 12/2009 |
| TW | I227268 A | 2/2005 |
| TW | 200617150 | 6/2006 |

OTHER PUBLICATIONS

German Office Action issued Feb. 8, 2013 for Application No. 112010002227.5 (12 Pages).

Invalidation Trials regarding corresponding Korean Patent No. 1285120, filed in the Korean Patent Intellectual Property Tribunal (KIPT) on Oct. 22, 2013 (24 pages).

Korean Intellectual Property Office, Tribunal Decision regarding corresponding KR Patent No. 1285120 dated Aug. 27, 2014 (45 pages).

* cited by examiner (a)

(b)

METHOD OF POLISHING A SILICON WAFER

TECHNICAL FIELD

This invention relates to a method of polishing a silicon wafer in which a polishing solution containing abrasive grains is applied onto a surface of a polishing pad and then the polishing pad is relatively slid to a silicon wafer to polish the surface of the silicon wafer.

BACKGROUND ART

As the polishing solution used for polishing the surface of the silicon wafer is widely used an alkali solution containing silica particles as free abrasive grain since early times. Also, a chemical mechanical polishing (mechanochemical polishing) with a polishing solution containing fine silica particles as abrasive grains is common in the polishing of the silicon wafer. This polishing method is a method of combining the mechanical polishing action of the fine silica particles with the chemical polishing action of the alkali solution, and is known to provide a mirror surface having excellent smoothness and crystallinity.

When the silicon wafer is polished with the polishing solution containing abrasive grains as mentioned above, it is demanded to provide a high processing speed and a certain wafer flatness. Particularly, silicon wafers having a high flatness without surface defect are required in finish polishing during final polishing step of the production process for silicon wafer, so that it is attempted to rationalize polishing conditions such as polishing solution, polishing cloth and the like by various methods. For example, as disclosed in Patent Document 1, there is a method of producing a high-flatness wafer by supplying a polishing solution containing abrasive grains onto a polishing cloth expanded over a polishing plate and polishing surfaces of plural semiconductor wafers, which are attached to a carrier plate with wax, while adjusting a polishing pressure between a central portion and an outer peripheral portion of the carrier plate.

In the polishing method of Patent Document 1, however, a certain effect is developed as to the flatness of the wafer, but since the polishing solution used contains a great number of substances such as abrasive grains, alkali, high polymer and so on, these substances are retained on the surface of the silicon wafer after the polishing and cleaning to newly cause problems such as PID (process induced defect) and defects due to attachment of particles.

PRIOR ART DOCUMENTS

Patent Documents

Patent Document 1: JP-A-2000-288909

SUMMARY OF THE INVENTION

Problems to be Solved by the Invention

It is therefore, an object of the invention to provide a method of polishing a silicon wafer wherein a high flatness can be attained likewise the conventional polishing method and further the occurrence of defects due to the remaining of substances included in the polishing solution on the surface of the wafer can be suppressed as well as a polished silicon wafer.

Means for Solving Problems

The inventors have made various investigations in order to solve the above problems in the method of polishing silicon wafer by supplying a polishing solution containing abrasive grains onto a surface of a polishing pad and relatively sliding the polishing pad to the silicon wafer to polish the surface of the silicon wafer and found that PID and defects due to the attachment of particles can be largely suppressed by controlling the number of abrasive grains among substances included in the polishing solution. As a result of further studies, it has been found that the desired surface roughness can be attained by controlling the number of abrasive grains to not more than $5\times10^{13}$ grains/cm$^3$ but also there is obtained a polishing method capable of suppressing the occurrence of defects such as PID and the like resulted from the substances included in the polishing solution.

In order to achieve the above object, the summary and construction of the invention are as follows.

(1) A method of polishing a silicon wafer by supplying a polishing solution containing abrasive grains onto a surface of a polishing pad and then relatively sliding the polishing pad to a silicon wafer to polish the surface of the silicon wafer, characterized in that the number of abrasive grains included in the polishing solution is controlled to not more than $5\times10^{13}$ grains/cm$^3$.

(2) The method of polishing a silicon wafer according to the item (1), wherein the abrasive grains have a mean primary grain size of 10-70 nm as calculated according to BET method.

(3) The method of polishing a silicon wafer according to the item (1) or (2), wherein the abrasive grains contain $SiO_2$.

(4) The method of polishing a silicon wafer according to the item (1), (2) or (3), wherein the polishing solution has a polishing rate to silicon of not less than 5 nm/min.

(5) The method of polishing a silicon wafer according to any one of the items (1) to (4), wherein the polishing solution contains a basic compound and a water-soluble polymer compound.

(6) The method of polishing a silicon wafer according to the item (5), wherein the basic compound is a nitrogen-containing basic compound.

(7) The method of polishing a silicon wafer according to the item (5), wherein the water-soluble polymer compound is at least one of cellulose derivatives and polyvinyl alcohol.

(8) The method of polishing a silicon wafer according to any one of the items (1) to (7), wherein the polishing of the silicon wafer is carried out as a finish polishing during final polishing step in silicon wafer production process.

(9) A silicon wafer polished by a method as described in any one of the items (1) to (8), in which the number of surface defects on the polished surface of the wafer is not more than 20 as a found value when defects having a size of not less than 35 nm are measured by a particle counter and as converted to a wafer having a diameter of 300 mm.

Effect of the Invention

According to the invention, there can be provided a method of polishing a silicon wafer which can attain a high flatness and suppress the occurrence of defects resulted from the remaining of substances included in the polishing solution on the surface of the wafer.

DESCRIPTION OF THE PREFERRED EMBODIMENTS

The method of polishing a silicon wafer according to the invention is a method of polishing a silicon wafer in which a polishing solution containing abrasive grains is supplied onto a surface of a polishing pad and then the polishing pad is relatively slid to a silicon wafer to polish the surface of the silicon wafer.

The polishing method according to the invention is characterized by controlling the number of abrasive grains included in the polishing solution to not more than $5 \times 10^{13}$ grains/cm$^3$. When the number of abrasive grains is made to not more than $5 \times 10^{13}$ grains/cm$^3$, the occurrence of defects such as PID and attachment of components included in the polishing solution can be suppressed effectively but also good surface roughness on the surface of the silicon wafer can be attained likewise the conventional polishing method.

Figure 1:
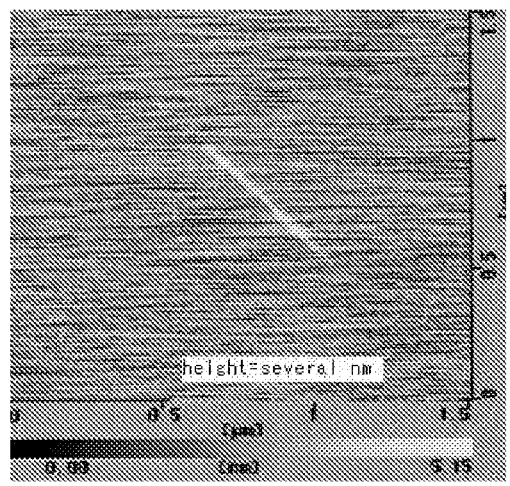
FIG. 1 is a photograph illustrating defects resulted from the remaining of substances included in a polishing solution on a surface of a wafer, wherein (a) shows PID and (b) shows a defect due to attachment of particles.
Figure 1:
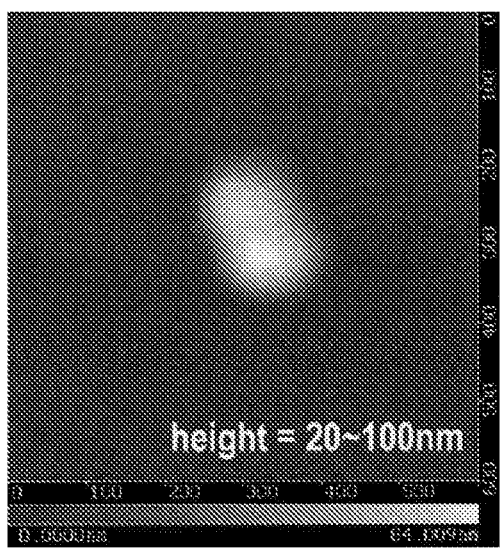

Here, PID is a minimal defect of nanometer order having a linear protruding form as shown in FIG. 1(a) and resulted from abrasive grains and other foreign matters included in the polishing solution. On the other hand, the defect due to the attachment of components included in the polishing solution is a minimal defect generated by adhering fine particle component such as abrasive grains and the like to the surface of the wafer as shown in FIG. 1(b). These defects are not defects generated in the pulling step of silicon single crystal but are minimal defects newly generated by the substances included in the polishing solution at the polishing step. Since they can not be removed even by cleaning the wafer after the polishing, it is very important to suppress the occurrence of these defects at the polishing step as in the invention.

Moreover, the reason why the number of abrasive grains is controlled to not more than $5 \times 10^{13}$ grains/cm$^3$ is due to the fact that when it exceeds $5 \times 10^{13}$ grains/cm3, the number of abrasive grains becomes too large and there is a fear of causing the occurrence of the above defects. On the other hand, when the number of abrasive grains is too small, the capacity of polishing the wafer surface lowers, so that the lower limit on the number of abrasive grains is preferable to be not less than $2 \times 10^{13}$ grains/cm$^3$ from a viewpoint of surely improving the surface roughness of the wafer surface.

Also, the abrasive grains are preferable to have a mean primary grain size of 10-70 nm as calculated according to BET method (specific surface area measuring method). When the grain size is less than 10 nm, the grains are aggregated to form coarse particles having a larger grain size and there is a fear of causing PID by these coarse particles, while when it exceeds 70 nm, the grain size is too large and there is a fear of deteriorating the roughness of the wafer surface after the polishing. Further, the mean primary grain size of 20-40 nm is more preferable because PID can be further reduced but also the deterioration of the roughness of the wafer surface after the polishing can be prevented. Moreover, the mean primary grain size calculated according to BET method means a value obtained by converting specific surface area to diameter of spherical particle by BET method (which is a method wherein a specific surface area of a sample is determined from an amount measured by adsorbing molecules of a given adsorption occupied area onto surfaces of sample power particles at a liquid nitrogen temperature).

As the abrasive grain can be used ceramics such as silica, alumina and the like; simple substance or compounds such as diamond, silicon carbide and the like; and high polymers such as polyethylene, polypropylene and the like. Moreover, the abrasive grain is preferable to comprise $SiO_2$ in view of low cost, dispersibility in a slurry solution, control easiness of grain size in abrasive grains and so on. In addition, as $SiO_2$ can be used those prepared, for example, by any of dry process (combustion process, arc process) and wet process (settlement process, sol-gel process). Furthermore, the form of the abrasive grain is mainly particulate, but may be gel if the above conditions (number of particles, mean grain size and so on) are satisfied.

The polishing solution is not particularly limited as long as it can polish the silicon wafer, but it is preferable to use a polishing solution having a polishing rate to silicon of not less than 5 nm/min. In the invention, the number of abrasive grains included in the polishing solution is not more than $5 \times 10^{13}$ grains/cm$^3$, which is lower than the number of abrasive grains included in the conventional polishing solution, so that the mechanical polishing capacity tends to be somewhat reduced. Therefore, if the polishing rate is less than 5 nm/min, the polishing rate is too small, and the wafer surface can not be polished sufficiently, and hence the desired surface roughness may not be obtained.

Also, the polishing solution is preferable to contain a basic compound from a viewpoint that chemical polishing action is obtained effectively, and a water-soluble polymer compound from a viewpoint that the wettability is ensured on the wafer surface after the polishing. It is more preferable that the basic compound is a nitrogen-containing basic compound such as ammonia or the like and the water-soluble polymer compound is one of cellulose derivatives such as hydroxyethyl cellulose and so on and polyvinyl alcohol. Meanwhile, basic compounds other than the above nitrogen-containing basic compound are strong in the etching action and may not provide the desired wafer surface roughness, and water-soluble polymer compounds other than the above cellulose derivatives and polyvinyl alcohol may not provide sufficient wettability on the wafer surface.

In the polishing method according to the invention, the surface of the silicon wafer is polished by relatively sliding the polishing pad to the silicon wafer. The sliding method is not particularly limited. For example, the sliding may be conducted by moving only the polishing pad or only the silicon wafer, or the sliding may be carried out by relatively moving the polishing pad and the silicon wafer. Further, conditions such as pressure applied to the polishing pad, relative sliding speed of the polishing pad and/or viscosity of the polishing solution are not particularly limited, and can be controlled optionally to conduct the polishing.

Figure 2:
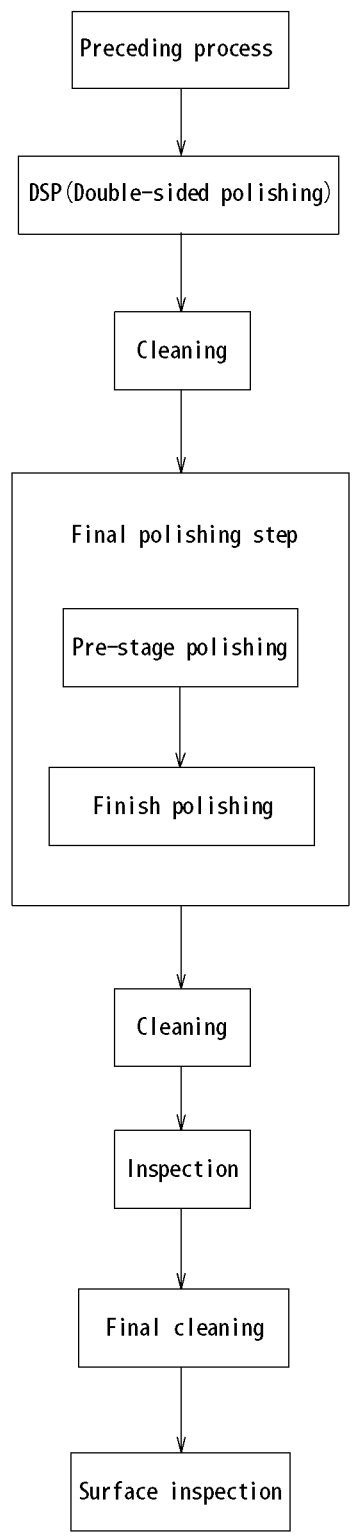
FIG. 2 is a flow chart illustrating for positioning of final polishing step during steps of producing wafer according to the invention.

Also, the polishing of the silicon wafer according to the invention is preferable to be conducted as a finish polishing during the final polishing step in the production process of the silicon wafer as shown in FIG. 2. The finish polishing in the final polishing step is a final polishing for finishing the silicon wafer into a product. If defects are caused in this step, they can not be removed subsequently. According to the invention, the occurrence of the defects such as PID and the like can be suppressed, so that it is possible to obtain high-quality silicon wafers.

In the silicon wafer polished by the polishing method according to the invention, the number of surface defects on the polished surface of the wafer is not more than 20 as a found value when the number of defects having a size of not less than 35 nm are measured with a particle counter and as converted to a wafer of 300 mm in diameter, and hence high-quality wafers being less in the defects can be obtained.

Moreover, the above is described by way of example only with respect to embodiments of the invention, so that various modifications may be added within a range of claims.

EXAMPLES

Preparation of Samples for Evaluation

As to a silicon wafer of 300 mm in diameter, the polishing of silicon wafer surface is conducted as a finish polishing of a final polishing step by supplying a polishing solution containing abrasive grains onto a polishing pad of polyurethane and relatively sliding the polishing pad to the silicon wafer.

With respect to each of sample Nos. 1-6 for evaluation, conditions of the polishing solution used in the polishing (polishing rate to silicon, components included) and conditions of the abrasive grain (number, mean grain size, type) are shown in Table 1. Also, three wafers are prepared every each sample for evaluation.

(Evaluation Method)

With respect to each sample for evaluation prepared as mentioned above are evaluated (1) number of PID and (2) flatness of wafer surface. Moreover, the evaluation is performed by calculating an average value of three wafers as a sample for evaluation.

(1) Number of PID

The number of defects having a size of not less than 35 nm, which are existent on the surface of the wafer as a sample for evaluation, is measured with Surfscan SP2 made by KLA-Tnecor Corporation, and the number of PID is determined when defects classified into LPD-N among defects detected by Surfscan SP2 are defined as PID. The measured number of PID is converted to a wafer of 300 mm in diameter or is the number on the surface of the wafer having a diameter of 300 mm. The number of PID is evaluated according to the following scale: the number of not more than 3 is ○, and the number of more than 3 but not less than 10 is Δ, and the number of more than 10 is χ. The results are shown in Table 1.

Figure 3:
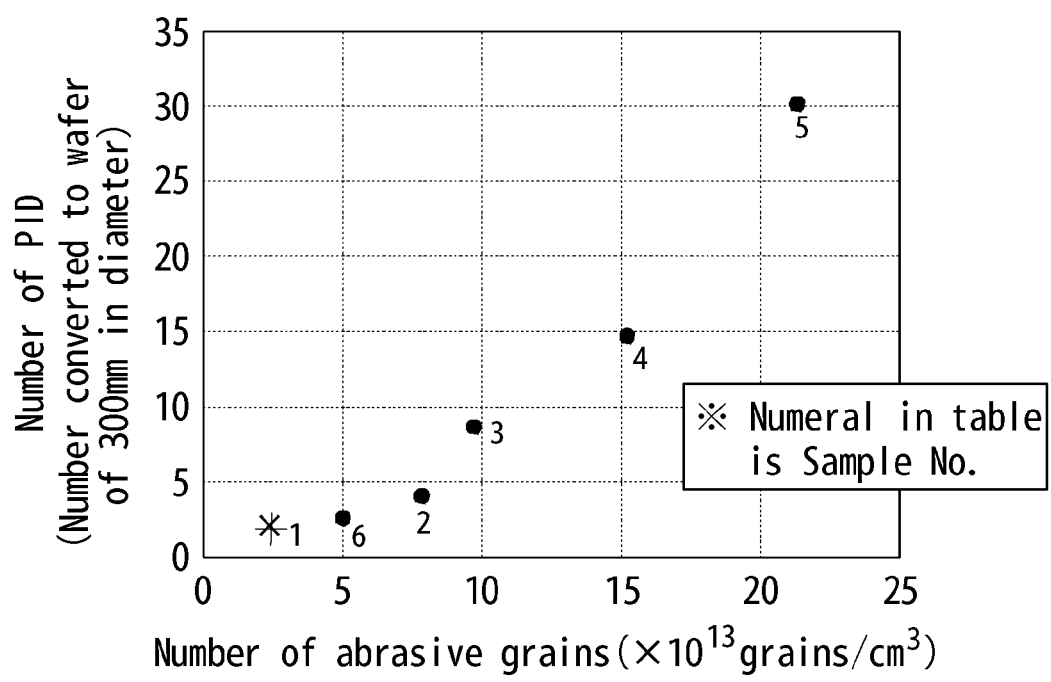
FIG. 3 is a graph showing a relation between the number of abrasive grains included in a polishing solution and the number of PID generated on a surface of a wafer.

Also, a relation between the number of abrasive grains in the polishing solution and the number of PID defects generated in each sample is shown in FIG. 3 as a graph.

(2) Flatness of Wafer Surface

The flatness of wafer surface of each sample is measured with WaferSight made by KLA-Tencor Corporation, and the evaluation on the flatness of wafer surface is conducted according to the following scale: flatness of not more than 60 nm is ○ and flatness of more than 60 nm is χ. The results are shown in Table 1.

As shown in Table 1 and FIG. 3, silicon wafers being small in the number of PID and having a high flatness are obtained in Sample Nos. 1 and 6 wherein the number of abrasive grains in the polishing solution is not more than $5 \times 10^{13}/cm^3$. On the contrary. Sample Nos. 2-5 having the number of abrasive grains in polishing solution of more than $5 \times 10^{13}/cm^{13}$ have a high flatness, but can not suppress the occurrence of PID sufficiently.

INDUSTRIAL APPLICABILITY

According to the invention, there can be provided a method of polishing a silicon wafer which can attain a high flatness likewise the conventional polishing method and can further suppress the occurrence of defects resulted from the remaining of substances included in the polishing solution on the surface of the wafer.

The invention claimed is:

1. A method of polishing a silicon wafer by supplying a polishing solution containing abrasive grains onto a surface of a polishing pad and then relatively sliding the polishing pad to a silicon wafer to polish the silicon surface of the silicon wafer, characterized in that the number of abrasive grains included in the polishing solution is controlled to not more than $5 \times 10^{13}$ grains/$cm^3$ and wherein the abrasive grains have a mean primary grain size of 10-70 nm as calculated according to BET method.

2. The method of polishing a silicon wafer according to claim 1, wherein the abrasive grains contain $SiO_2$.

3. The method of polishing a silicon wafer according to claim 1, wherein the polishing solution has a polishing rate to silicon of not less than 5 nm/min.

4. The method of polishing a silicon wafer according to claim 1, wherein the polishing solution contains a basic compound and a water-soluble polymer compound.

5. The method of polishing a silicon wafer according to claim 4, wherein the basic compound is a nitrogen-containing basic compound.

6. The method of polishing a silicon wafer according to claim 4, wherein the water-soluble polymer compound is at least one of cellulose derivatives and polyvinyl alcohol.

7. The method of polishing a silicon wafer according to any one of claims 1 and 2 to 6, wherein the polishing of the silicon wafer is carried out as a finish polishing during final polishing step in silicon wafer production process.

* * * * *

TABLE 1

| | Polishing solution | | Abrasive grains | | | | Number of PID | | Flatness | |
|---|---|---|---|---|---|---|---|---|---|---|
| Sample No. | Polishing rate to silicon | Components included* | Number (grains/$cm^3$) | Mean grain size (nm) | Type | Remarks | Number | Evaluation | Flatness | Evaluation |
| 1 | 10 nm/min. | $NH_3$; HEC | $2.43 \times 10^{13}$ | 35 | $SiO_2$ | Example | 2 | ○ | 35 nm | ○ |
| 2 | 13 nm/min | $NH_3$, HEC | $7.78 \times 10^{13}$ | 35 | $SiO_2$ | Comparative Example | 4 | Δ | 34 nm | ○ |
| 3 | 15 nm/min | $NH_3$, HEC | $9.72 \times 10^{13}$ | 35 | $SiO_2$ | Comparative Example | 9 | Δ | 35 nm | ○ |
| 4 | 14 nm/min | $NH_3$, HEC | $15.1 \times 10^{13}$ | 24 | $SiO_2$ | Comparative Example | 15 | X | 36 nm | ○ |
| 5 | 14 nm/min | $NH_3$, HEC | $21.21 \times 10^{13}$ | 24 | $SiO_2$ | Comparative Example | 30 | X | 38 nm | ○ |
| 6 | 12 nm/min | $NH_3$, HEC | $5.00 \times 10^{13}$ | 35 | $SiO_2$ | Example | 3 | ○ | 36 nm | ○ |

*As to components included, $NH_3$: ammonia, HEC: hydroxyethyl cellulose